United States Patent [19]

Pazhouhesh et al.

[11] Patent Number: 5,127,572

[45] Date of Patent: Jul. 7, 1992

[54] SOLDERING METHOD AND TOOL

[76] Inventors: Manouchehr Pazhouhesh; Deborah J. Pazhouhesh, both of 1125 Woodington Cir., Lawrenceville, Ga. 30244

[21] Appl. No.: 672,099

[22] Filed: Mar. 19, 1991

Related U.S. Application Data

[63] Continuation-in-part of Ser. No. 439,181, Nov. 20, 1989.

[51] Int. Cl.$^5$ ............................ B23K 1/00; H05K 3/34
[52] U.S. Cl. ...................................... 228/179; 228/258; 228/52
[58] Field of Search ................... 228/179, 180.2, 258, 228/52

[56] References Cited

U.S. PATENT DOCUMENTS

| | | | |
|---|---|---|---|
| 1,172,161 | 2/1916 | Moench | 228/52 |
| 1,741,707 | 12/1929 | Miller | 228/52 |
| 2,382,390 | 8/1945 | Bergman | 113/109 |
| 3,580,462 | 5/1971 | Vanyi | 228/52 |
| 3,941,292 | 3/1976 | Osipov et al. | 228/35 |
| 4,607,151 | 8/1986 | Kihlstrom | 219/230 |

FOREIGN PATENT DOCUMENTS

| | | | |
|---|---|---|---|
| 2323486 | 5/1977 | France | 228/52 |
| 206042 | 1/1984 | German Democratic Rep. | 228/258 |
| 137577 | 6/1988 | Japan | 228/52 |
| 2007644 | 9/1976 | U.S.S.R. | 228/258 |

Primary Examiner—Samuel M. Heinrich
Attorney, Agent, or Firm—B. J. Powell

[57] ABSTRACT

The method of the invention comprises the steps of locating the integrated circuit so that the projecting ends of the pins thereon are in juxtaposition with the corresponding connector pads on the printed circuit board; and applying solder to the connector pads with a heated soldering tool moving over the pads and touching the projecting ends of the pins on the integrated circuit without overlying the pins to solder the projecting ends of the pins to the connector pads. The method of the invention further comprises the step of applying a soldering flux to the pins and connector pads prior to applying the solder with the soldering iron. After the soldering operation is complete, the flux is removed with a flux remover. If the connector pads are new, a base solder is applied to the connector pads prior to placement of the integrated circuit on the printed circuit board.

5 Claims, 1 Drawing Sheet

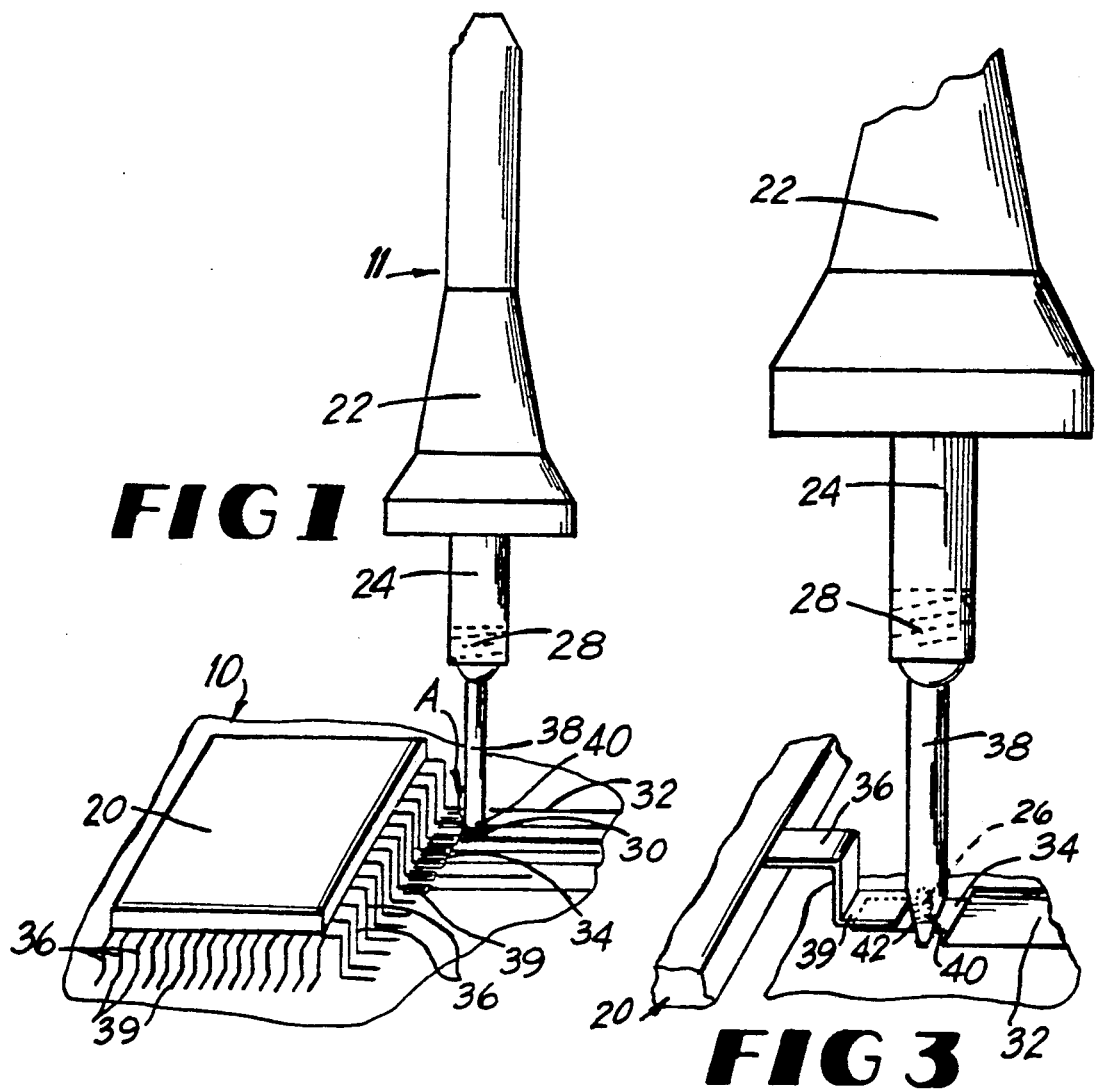
FIG 1
FIG 3
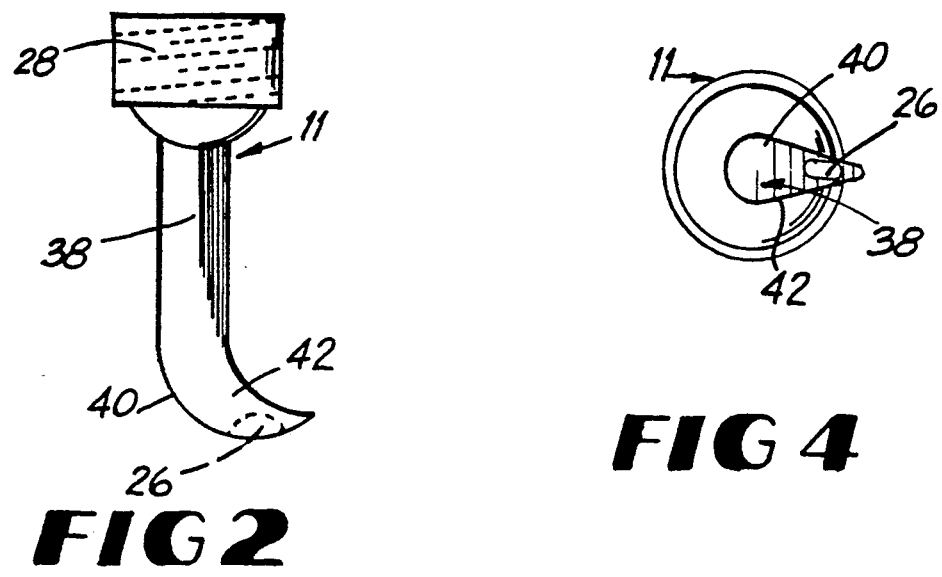
FIG 2
FIG 4

SOLDERING METHOD AND TOOL

CROSS REFERENCE TO RELATED APPLICATIONS

This application is continuation-in-part of our co-pending application Ser. No. 07/439,181, filed Nov. 20, 1989.

BACKGROUND OF THE INVENTION

This invention relates generally to soldering techniques, sectional and slanted soldering iron tip designs, and more particularly to the improved soldering of flat pack integrated circuits (ICs) to printed circuit boards (PCBs) and for general soldering applications.

Heretofore, the soldering techniques and conventional soldering iron tip tools have many disadvantages when soldering the pins of flat pack integrated circuits (Ics) to printed circuit boards (PCBs). When integrated circuits are soldered into place on printed circuit boards in a manufacturing environment, very large and expensive equipment is used to simultaneously solder all of the pins on the integrated circuit individually to the appropriate connected on the printed circuit board. When it is necessary to replace a faulty integrated circuit, however, it is not economical to use the machines in the manufacturing plant to carry out this individual replacement. Today, integrated circuits are replaced on already manufactured printed circuit boards by attempting to solder each individual pin on the integrated circuit to the corresponding connector on the printed circuit board one by one. This method is not economically feasible because it requires approximately one to two hours to replace a single flat pack integrated circuit with 100 pins or more. Moreover, the quality of the resulting soldered joint is poor and many times not functional because the solder bridges between adjacent pins on the integrated circuit. Often times breakage occurs in the joint on the printed circuit board due to too much pressure having been applied by the soldering iron tip during the replacement.

As a result, there is a need for a simple technique or method of soldering replacement integrated circuits in place which can be performed quickly and solders the new integrated circuits to the printed circuit board with the same quality as the initially manufactured assembly.

SUMMARY OF THE INVENTION

These and other problems and disadvantages associated with the prior art are overcome by the invention disclosed herein by providing a soldering technique or method which quickly, easily, reliably and neatly solders flat pack integrated circuits to printed circuit boards when a flat pack integrated circuit fails and requires replacement. Moreover, the method of the invention provides an economical way to replace the integrated circuits on printed circuit boards.

The method of the invention comprises the steps of locating the integrated circuit so that the projecting ends of the pins thereon are in juxtaposition with the corresponding connector pads on the printed circuit board; and applying solder to the connector pads with a heated soldering tool moving over the pads and touching the projecting ends of the pins on the integrated circuit without overlying the pins to solder the projecting ends of the pins to the connector pads. The method of the invention further comprises the step of applying a soldering flux to the pins and connector pads prior to applying the solder with the soldering iron. After the soldering operation is complete, the flux is removed with a flux remover. If the connector pads are new, a base solder is applied to the connector pads prior to placement of the integrated circuit on the printed circuit board.

These and other features and advantages of the invention will become more clearly understood upon consideration of the following detailed decryption and accompanying drawings wherein like characters of reference designate corresponding parts throughout the several views and in which:

BRIEF DESCRIPTION OF THE DRAWINGS

FIG. 1 is a perspective view of a large scale flat pack integrated circuit to be attached to the printed circuit board using the invention with a soldering tool;

FIG. 2 is an enlarged side view of the tip of the soldering tool;

FIG. 3 is an edge view of the integrated circuit as it is being installed; and,

FIG. 4 is an enlarged face view of the tip of the soldering tool.

These figures and the following detailed description disclose specific embodiments of the invention, however, it is to be understood that the inventive concept is not limited thereto since it may be embodied in other forms.

DETAILED DESCRIPTION OF ILLUSTRATIVE EMBODIMENTS

FIG. 1 shows a flat pack integrated circuit 20 positioned on a printed circuit board 10 to be soldered in place. The circuit 20 has a plurality of Z-shaped pins 36 which must be individually soldered to the corresponding connector pads 34 at the ends of the printed circuit board tracks 32 to properly connect the circuit 20 to the printed circuit board 10. Each of the pins 36 has a projecting end 39 which lies in juxtaposition with its corresponding connector pad 34 as seen in FIG. 3 when the integrated circuit 20 is in place on the printed circuit board 10. Thus the projecting end 39 projects above the plane of the pad 34.

The pins 36 are soldered to the pads 34 with a soldering iron 11. The soldering iron 11 includes a soldering iron handle 22 provided with a heating element 24 and a heated tip 38. The tip 38 defines a curved planar soldering surface 40 thereon. A solder retaining recess 26 is defined in the tip 38 which opens onto the surface 39.

METHOD OF THE INVENTION

If the pads 34 on the printed circuit board 10 are not already coated with solder, a coating of solder is applied prior to placement of the integrated circuit 20 on the printed circuit board. This coating of solder is sufficiently thin so that it does not bridge the space between the pads 34.

The integrated circuit 20 is placed on the printed circuit board 10 so that the projecting ends 39 of the pins 36 overlie the corresponding pads 34. The integrated circuit 20 is then fixed with respect to the printed circuit board 10. While any convenient arrangement may be used to fix the integrated circuit 20 with respect to the printed circuit board, tack soldering the pins 36 at the corners of the integrated circuit 20 has worked satisfactorily.

After the integrated circuit 20 is fixed in position, a soldering flux is applied to the pads 34 and pins 36. For best results, an excess amount of the flux is applied to fully coat the area around the connections to be made.

Next, the curved tip surface 40 on the heated tip 38 is placed on the pads 34 without the surface 40 overlying the pins 36 on the integrated circuit 20 as best seen in FIG. 3. Additional solder is then applied to the tip 38 to coat the tip surface 40 and fill the recess 26 opening onto the tip surface 40. While holding the tool 11 so that the tip 38 is generally vertically oriented, the worker slides the surface 40 across the connector pads 34 from point A to point B as seen in FIG. 1. At the same time, the worker keeps the edge 42 of the tip 38 contacting the ends 39 of the pins 36. The combination of the flux and the maintenance of the pool of excess solder in the recess 26 causes the solder to coat the interface between the pin 36 and the connector pad 34 to firmly solder the pins 36 to the connector pads 34 and thus attach the integrated circuit 20 to the printed circuit board 10. Further, it will be noted that the cohesive forces in the solder causes the solder to only coat the pin/connector pad interface and not leave enough solder to bridge between pins 36 and/or connector pads 34.

What is claimed as invention is:

1. A method of soldering the projecting end portions of the pins of a flat pack integrated circuit to the connector pads on a printed circuit board comprising the steps of:
   a) locating the flat pack integrated circuit so that the projecting end portions of the pins thereon lie on top of the corresponding connector pads on the printed circuit board; and,
   b) applying solder to the connector pads with a heated soldering tool by moving the soldering tool over the top surfaces of the connector pads with the side of the soldering tool touching the projectingmost tips of the projecting end portions of the pins on the integrated circuit without the tool passing over the tops of the projecting end portions of the pins to solder the projecting end portions of the pins to the connector pads.

2. The method of claim 1 further comprising the step of:
   c) applying a soldering flux to the pins and connector pads prior to applying the solder with the soldering iron.

3. The method of claim 1 further comprising the step of applying a base solder to the connector pads prior to step a).

4. The method of claim 2 further comprising the step of:
   d) removing the soldering flux with a flux remover after step b).

5. The method of claim 1 wherein step b) comprising the substeps of:
   b1) touching the working face of the heated tip of the soldering tool to the top surface of the connector pads;
   b2) applying solder to the working face of the heated tip of the soldering tool so that excess solder is on the working face; and
   b3) moving the working face of the heated tip of the soldering tool with the excess solder thereon across and touching the top surfaces of the connector pads with the side of the heated tip touching the projectingmost tips of the projecting end portions of the pins on the integrated circuit.

* * * * *